United States Patent [19]

Naylor et al.

[11] Patent Number: 4,611,178
[45] Date of Patent: Sep. 9, 1986

[54] PUSH-PULL OUTPUT CIRCUIT

[75] Inventors: Jimmy R. Naylor; David F. Mietus, both of Tucson, Ariz.

[73] Assignee: Burr-Brown Corporation, Tucson, Ariz.

[21] Appl. No.: 732,168

[22] Filed: May 8, 1985

[51] Int. Cl.$^4$ ............................................. H03F 3/30
[52] U.S. Cl. .................................... 330/272; 330/273; 330/275
[58] Field of Search ................. 330/207 P, 262, 271, 330/272, 273, 298, 275, 255, 270, 274

[56] References Cited

U.S. PATENT DOCUMENTS

| 3,376,515 | 4/1968 | Dilley | 330/271 X |
| 3,636,464 | 1/1972 | Gilbert | 330/298 |
| 3,855,540 | 12/1984 | Leidich | 330/273 |
| 3,988,693 | 10/1976 | Seki | 330/298 |
| 4,058,775 | 11/1977 | Crowle | 330/298 X |
| 4,152,668 | 5/1979 | Kusumi | 330/298 |
| 4,232,273 | 11/1980 | Leidich | 330/298 |
| 4,288,755 | 9/1981 | Sakai | 330/298 |

Primary Examiner—James B. Mullins
Attorney, Agent, or Firm—Cahill, Sutton & Thomas

[57] ABSTRACT

A low voltage sixteen bit digital-to-analog converter operable between +5 and −5 volt power supplies and capable of providing output voltage levels to within about 1.4 volts of $+V_{CC}$ and $-V_{CC}$ includes a push-pull output stage with only a pullup transistor and a pulldown transistor connected in series between the positive and negative supply voltages. The output stage includes circuitry that reduces the base voltage of the pullup transistor or pulldown transistor enough to reduce its collector current to near zero, greatly increasing its effective collector-to-emitter breakdown voltage.

12 Claims, 4 Drawing Figures

PUSH-PULL OUTPUT CIRCUIT

CROSS-REFERENCE TO RELATED APPLICATIONS

This application is related to the co-pending application "Bit Adjustment and Filter Circuit for Digital-To-Analog Converter", Ser. No. 732,229, by Jimmy Ray Naylor and Frederick J. Highton and the application "Input Level Shifting Circuit for Low Voltage Digital-To-Analog Converter", Ser. No. 732,162, by Jimmy Ray Naylor, both filed on even date herewith and assigned to the present assignee.

BACKGROUND OF THE INVENTION

The invention relates to integrated circuit digital-to-analog converters, and especially to push-pull output circuits which can be used over a wide range of high and low voltage power supply voltages without provision of zener diodes and additional collector-to-emitter voltage drops in series with the pullup and pulldown transistors, and also relates to circuitry which provides increased "head room" to make possible "high" output voltage levels of about 1.4 volts below the positive supply and above the $-V_{CC}$ voltage.

Various digital-to-analog converter circuits are known. As the state-of-the-art has advanced, monolithic digital-to-analog converters (DACs) capable of increased accuracy, greater bandwidth (i.e., operating speed), and capable of operating from fairly low magnitude power supply voltages have been developed. Nevertheless, further improvements in each of these areas are highly desirable in order to broaden the markets for DACs, by making it economically practical to use DACs in a larger range of low cost products. It is highly desirable to provide in a monolithic integrated circuit, particularly a monolithic DAC, the capability of operating (within predetermined specifications) not only from very low magnitude power supply voltages, but also from very high magnitude power supply voltages. Providing such capability in an integrated circuit, particularly in a monolithic DAC, imposes various difficulties upon the circuit designer. For example, provision of the capability of operating from low magnitude power supply voltages often presents the problem of generating adequate internal operating voltages in response to "worst case" TTL input signals. Use of low magnitude power supply voltages also makes it difficult to generate the maximum output voltages that usually are required. The term "head room" is sometimes used by those skilled in the art to describe the problem of obtaining suitable output signal levels in an integrated circuit when either or both of the power supply voltage magnitudes are low, for example, +4.75 volts or −4.75 volts. It is difficult to generate adequately high output voltages if the circuit has little "head room" when a low positive power supply voltage is used. The same is true for a negative output swing when the negative supply is a low voltage. For a large positive output swing, the emitter-to-base voltage of an NPN pullup transistor must be included in the "head room", and a prior circuit stage must be provided to drive the base of the NPN pullup transistor. For modern, high speed, low power circuitry, those skilled in the art will recognize that such prior stages of circuitry also require adequate "head room" to accommodate the various emitter-to-base voltage drops and collector-to-emitter voltage drops that are needed to produce the signal that drives the base of the NPN pullup transistor. A similar condition applies to the NPN pulldown transistor.

When the power supply voltages ($+V_{CC}$ and/or $-V_{CC}$) are at a very high magnitude level, for example at +15 to +18 volts (or −15 to −18 volts), then, during certain operating conditions the collector-to-emitter breakdown voltages of the pullup and pulldown transistors are likely to be exceeded. This is likely to occur because typically, the normal collector-to-emitter breakdown voltage of the pullup and pulldown transistors, when they are "on", is roughly 20 volts for a typical high speed bipolar manufacturing process, and the collector-to-emitter voltages of the pullup and pulldown transistors can exceed this value if $+V_{CC}$ is +15 volts or higher and $-V_{CC}$ is −15 volts or more negative. To overcome this problem, additional active devices, such as transistors and zener diodes, have been provided in series with the pullup and pulldown transistors to "absorb" some of the collector-to-emiter overvoltages that would otherwise be applied to the pullup and pulldown transistors and cause them to break down. Both zener diode voltage drops and collector-to-emitter voltage drops have been provided in series relationship with the pullup and pulldown transistors to avoid the breakdowns that occur when high power supply voltages are applied to push-pull output circuits. The provision of such additional circuitry greatly complicates the design of a circuit, making the circuit more costly, often reducing its speed, increasing its power consumption, and reducing the "head room" needed to obtain adequate output signal levels. Another constraint faced by circuit designers of monolithic integrated circuits is the limited number of pins or leads of economical packages in which the chips must be housed.

Thus, it can be seen that there is a continuing need for improved circuit design techniques and structures which make it possible to provide circuit operation at specified high speeds, over a wide range of power supply voltages, with minimum circuit complexity, while requiring minimum area monolithic chip area to accomplish these goals.

There is a special need for an improved amplifier output structure that provides the capability of operation from both high magnitude and low magnitude power supply voltages and is capable of operating with minimum "head room" in order to produce the highest possible signal voltage levels when the positive and/or negative power supply voltage magnitudes are low.

Another major problem always faced by monolithic circuit designers is the complication produced by the requirement of providing circuit designs which not only meet the foregoing requirements, but also meet them over a wide range of temperatures.

SUMMARY OF THE INVENTION

It is an object of the invention to provide an improved output circuit that provides a maximum magnitude output signal level when a minimum magnitude power supply voltage is applied to the circuit, and yet also is capable of operation when the magnitude of the power supply voltage has a value that causes the normal collector-to-emitter breakdown voltage of the output transistors to be exceeded.

It is another object of the invention to provide an improved push-pull circuit that provides a maximum positive output signal level when a minimum positive power supply voltage is applied to the circuit, and yet also is capable of operation when the positive power supply voltage exceeds levels which cause the normal collector-to-emitter breakdown voltage of the output transistors to be exceeded.

It is another object of the invention to provide a push-pull output circuit that operates with minimum "head room" or minimum voltage difference between the positive power supply level and the maximum output signal level produced by the circuit.

It is another object of the invention to provide a push-pull output circuit that operates with a minimum voltage difference between the lowest or most negative power supply level and the minimum or most negative output signal level produced by the circuit.

Briefly described, and in accordance with one embodiment thereof, the invention provides an improved push-pull transistor circuit that provides a maximum magnitude output voltage by producing a minimum magnitude voltage drop between a first power supply voltage and a maximum value of output voltage level, and is operable at a large difference between the first power supply voltage and a second power supply voltage, which difference results in collector-to-emitter voltages that substantially exceed the normal collector-to-emitter breakdown voltage of a pullup transistor and a pulldown transistor therein, by producing feedback that reduces the collector current in the pullup or pulldown transistor that is not supplying or sinking output load current, to a sufficiently low level that the collector-to-emitter breakdown voltage of that pullup or pulldown transistor is increased to a value that exceeds the voltage difference between the output voltage and the first or second power supply voltage, by turning that transistor essentially or nearly off and providing a low-resistance path that allows essentially all of the reverse collection-base breakage current of that transistor to flow out of the base of that transistor. In the described embodiment of the invention, the collector of an NPN pullup transistor is connected directly to the positive power supply voltage. The emitter of the NPN pullup transistor is connected though a first resistor to the output terminal. A second resistor is connected between the output terminal and the base of the NPN pullup transistor. Both the base of the NPN pullup transistor and the second resistor are connected to a bias current source that also is coupled to the base of an NPN pulldown transistor and to a third resistor connected between the base of the NPN pulldown transistor and the negative supply voltage. A fourth resistor is connected between the emitter of the NPN pulldown transistor and the negative power supply voltage. A high output voltage across a load device increases the output current, thereby increasing the voltage drop across the first resistor and hence increasing the voltage drop across the second resistor and increasing the share of the bias current supplied to the conductor connected to the base of the NPN pullup transistor and the second resistor, and decreasing the share of the bias current supplied to the third resistor enough to turn off the NPN pulldown transistor and reduce the collector current of the NPN pulldown transistor to nearly zero, and allowing the reverse collector-base leakage current of the NPN pulldown transistor to flow out of its base through the third resistor, increasing its collector-to-emitter breakdown voltage to a safe level. When the output voltage is at a low level as a result of a large output current being drawn through the NPN pulldown device, the voltage across the fourth resistor increases, increasing the voltage across the third resistor. This decreases the portion of the bias current flowing to the second resistor and the NPN pullup transistor, reducing its collector current to zero, and allowing its reverse collector base leakage current to flow out of its base through the second resistor, increasing its collector-to-emitter breakdown voltage to a safe level. The effective shunt resistances connected to the bases of the pullup and pulldown transistors, when they are being turned off to raise their collector-to-emitter breakdown voltages as described above, is sufficiently low to cause collector-to-emitter leakage currents of those transistors to flow out of their bases, and prevent beta multiplication that would decrease their collector-to-emitter breakdown voltages. A current source circuit supplies the bias current and causes the value of the bias current to decrease with respect to increasing operating temperatures, and thereby allows the above described operation to continue as the emitter-to-base voltages of the NPN pullup transistor and the NPN pulldown transistor decrease with temperature at approximately $-2$ mV/°C.

DESCRIPTION OF THE INVENTION

Figure 1:
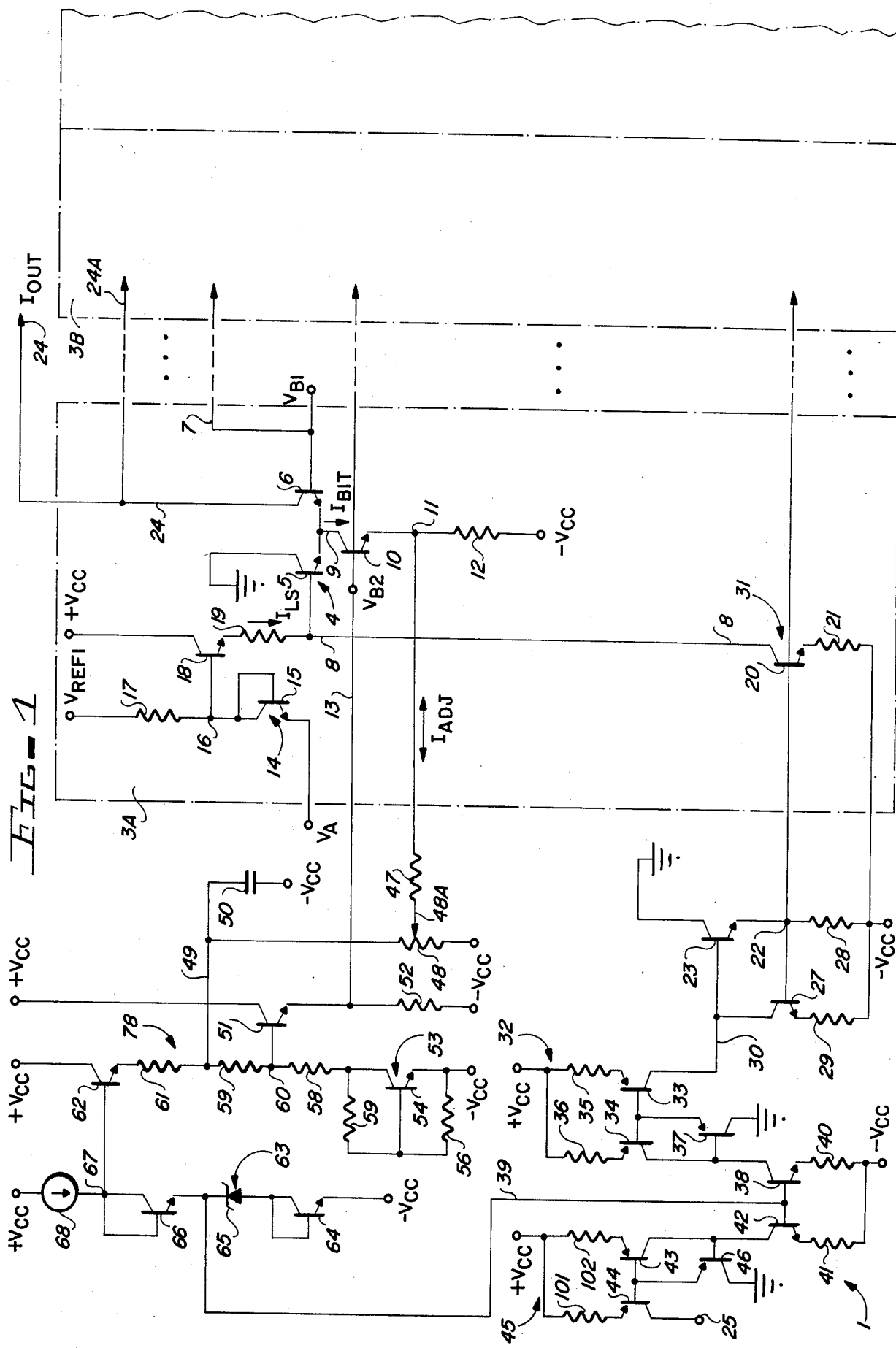
FIG. 1 is a schematic diagram of portion of a digital to analog converter in which the present invention can be used.
Figure 2:
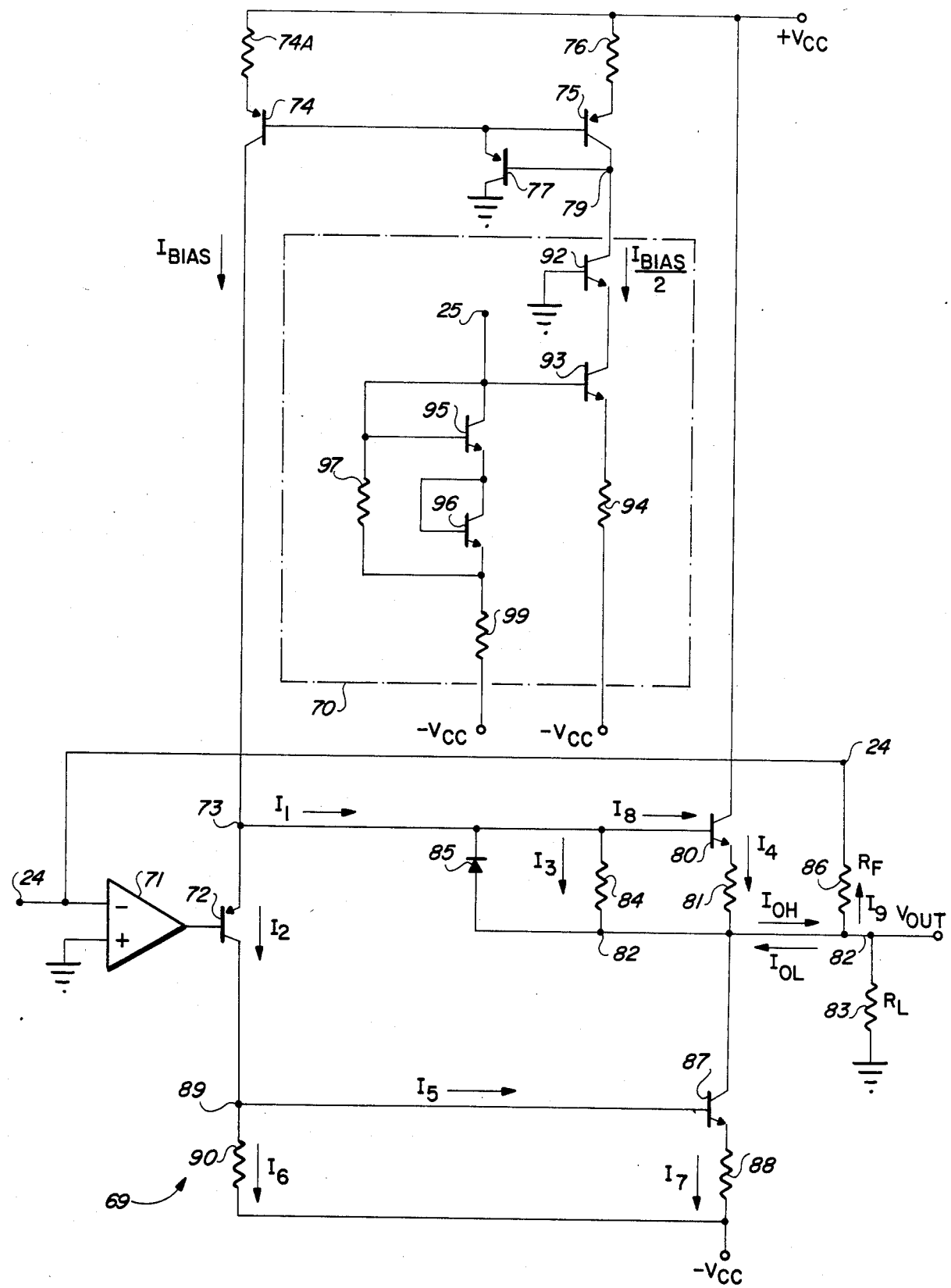
FIG. 2 is a schematic diagram of an output amplifier circuit which receives an analog summing current produced by the circuit of FIG. 1.

Referring now to FIGS. 1 and 2, digital to analog converter 1 includes a plurality of digital input terminals, such as input terminal 2, which are connected to a plurality of individual "bit circuits", such as bit circuit 3A. For example, if DAC 1 is a 16 bit DAC, there will be 16 "bit circuits" such as 3A, and 16 separate digital input terminals such as input terminal 2. In FIG. 1, only one bit circuit 3A is described in detail. The bit circuit 3A is the most significant bit in described DAC 1. Remaining bit circuits, such as 3B, are essentially similar to bit circuit 3A, except that they are not necessarily connected to a "bit current adjustment circuit", subsequently described. Appropriate binary bit current scaling by means of a conventional R-2R resistor ladder network is conventional, and is not shown.

Bit circuit 3A includes a precision resistor 12 connected between $-V_{CC}$ (the negative supply voltage conductor) and conductor 11. Conductor 11 is connected to the emitter of NPN "current source" transistor 10. The base of the current source transistor 10 of each of the bit circuits is connected to a conductor 13, which produces a temperature compensated bias voltage $V_{B2}$ thereon. The collector of current source transistor 10 of each bit circuit is connected to a conductor 9, which in turn is connected to the emitters of two NPN transistors, 5 and 6, which constitute an "emitter-coupled pair". Transistors 5 and 6 function as a bit current switch. The collector of bit current switch transistor 5 is connected to ground, and the collector of bit current switch transistor 6 is connected to a current summing conductor 24. Conductor 24A is connected in a conventional manner to receive other bit currents in an R-2R resistor ladder circuit. The base of transistor 5 is connected by conductor 8 to a level shifting circuit that shifts the voltage levels controlled by $V_A$ down to the levels required for proper operation of the base of bit current switch transistor 5. For each of the bit circuits, bit current $I_{BIT}$ is supplied in resistor 12 by the current source transistor 10, and is switched either to ground, when the base of transistor 5 is high, or into current summing conductor 24 when the base of transistor 5 is at a low voltage. The sum of all of the bit currents is an analog output current $I_{OUT}$. $I_{OUT}$ is applied to the negative input of a high gain differential amplifier 71, shown in FIG. 2.

A bias voltage $V_{B1}$ is applied to the base of bit current switch transistor 6 of each of the bit circuits such as 3A. Conventional temperature tracking bias circuitry can be provided easily by those skilled in the art to provide the bias voltage $V_{B1}$ applied to conductor 7.

Each of the bit circuits includes an input level shifting circuit including a diode 15, a pullup resistor 17, an NPN emitter follower transistor 18, a level shifting resistor 19, and a temperature compensated current source circuit 31.

A TTL compatible input voltage $V_A$ is applied to the emitter of diode-connected NPN transisror 15, the collector and base of which are connected by conductor 16 to pullup resistor 17 and NPN transistor 18. The upper terminal of resistor 17 is connected to a suitable reference voltage $V_{REF1}$. The collector of transistor 18 is connected to $+V_{CC}$, and the emitter thereof is connected by a nichrome resistor 19 to conductor 8. Conductor 8 is connected to the collector of an NPN transistor 20 of current source 31.

Current source circuit 31, by itself, is a one output of NPN current mirror circuit that is conventional; it includes NPN transistors 20, 23, and 27, with emitter resistors 21, 28, and 29, respectively. The bases of transistors 20 and 27 are connected to the emitter of transistor 23, the base of which is connected to the collector of transistor 27 by means of conductor 30. The current supplied to in the collector of transistor 27 determines the current $I_{LS}$ in the collector of transistor 20, and also in the transistors such as 20 in the other bit circuits which are not shown. The current in transistor 27 is determined by a separate PNP current mirror circuit 32. PNP current mirror circuit 32 includes PNP transistors 33 and 34 having their bases connected to the emitter of a PNP transistor 37. The base of transistor 37 is connected to the collector of PNP transistor 34. The emitters of transistors 33 and 34 are connected by emitter resistors 35 and 36 to $+V_{CC}$. The current through transistor 34, and hence transistor 33 and transistor 27 of current mirror 31, is determined by a precision nichrome resistor 40 that ratio-matches the shape and structure of the above mentioned nichrome resistor 19 of level shifting circuit 14. Resistor 40 is connected between the emitter of NPN transistor 38 and $-V_{CC}$. The collector of transistor 38 is connected to the collector and base of PNP transistors 34 and 37, respectively.

The base of transistor 38 is connected by conductor 39 to the cathode of a zener diode 65, which is included in a voltage reference circuit 63, in which current source 68 biases a string of components including temperature compensating diodes 64 and 66 and positive temperature coefficient zener diode 65.

Conductor 39 is also connected to the base of NPN transistor 42, which has a nichrome resistor 41 connected between the emitter of NPN transistor 42 and $-V_{CC}$. Nichrome resistor 41 is ratio-matched to resistor 97, subsequently described with reference to FIG. 2. The collector of transistor 42 is connected to a second PNP current mirror circuit 45, which is essentially similar to PNP current mirror circuit 32, and includes PNP transistors 43 and 44 having their bases connected to the emitter of PNP transistor 46, the base of which is connected to the collectors of transistors 42 and 43. The emitters of transistors 43 and 44 are coupled by resistors 102 and 101, respectively, to $+V_{CC}$. The collector of transistor 44 is connected by conductor 25 to the bias control circuit 70 subsequently described with reference to FIG. 2.

FIG. 1 also includes a circuit, designated by reference numeral 78, for generating the above mentioned bias voltage $V_{B2}$ on conductor 13 and for also effectuating precise bit current adjustment of one (or more) of the bit circuits of DAC 1. Circuit 78 includes an NPN emitter follower transistor 62 having its base connected to a reference voltage conductor 67 and having its emitter coupled by a 500 ohm resistor 61 to conductor 49. Conductor 49 is connected by a 6.15 kilohm resistor 59 to conductor 60, and conductor 60 is connected by means of a 3.35 kilohm resistor 58 to conductor 57. Conductor 57 is connected by means of a $V_{BE}$ multiplier circuit 53 to $-V_{CC}$. $V_{BE}$ multiplier circuit 53 includes an NPN transistor 54 having its emitter connected to $-V_{CC}$, its base connected by resistor 56 to $-V_{CC}$ and also connected to its collector by resistor 55. The collector of transistor 54 is also connected to conductor 57.

Conductor 60 is connected to the base of NPN transistor 51, the emitter of which is connected by resistor 52 to $-V_{CC}$. The emitter of transistor 51 is also connected to $V_{B2}$ conductor 13.

Conductor 49 is connected to an external filter capacitor 50 to $-V_{CC}$. Conductor 49 is also coupled by external potentiometer 48 to $-V_{CC}$. Potentiometer 48 has a variable resistance terminal 48A that is connected by resistor 47 to conductor 11.

Referring now to FIG. 2, previously mentioned differential amplifier 71 has its positive input connected to ground. Its output is connected to a push-pull unity gain output stage referred to by reference numeral 69. The circuitry of amplifier 71 is entirely conventional, and can be readily provided by those skilled in the art. Various typical low power, high gain differential amplifier circuits can be utilized to implement amplifier 71.

The output of amplifier 71 is connected to the base of PNP transistor 72, the emitter of which is connected to conductor 73 and the collector of which is connected by conductor 89 to the base of NPN pull-down transistor 87 and by resistor 90 to $-V_{CC}$. The emitter of pull-down transistor 87 is connected by resistor 88 to $-V_{CC}$.

Conductor 73 is connected to the collector of a PNP current source transistor 74, the emitter of which is coupled by emitter resistor 74A to $+V_{CC}$. Conductor 73 is also connected to the base of NPN pullup transistor 80, the collector of which is connected to $+V_{CC}$. PNP transistor 72 acts as an emitter follower which drives the base of NPN pullup transistor 80. The emitter of pullup transistor 80 is connected by 24 ohm resistor 81 to output conductor 82, on which an output voltage is produced. External load resistor $R_L$ is designated by reference numeral 83, and couples conductor 82 to ground. A feedback resistor 86, having value $R_F$, is coupled between output conductor 82 and conductor 24.

A 2 kilohm resistor 84 is connected between the base of pullup transistor 80 and output conductor 82. The anode of diode 85 is connected to conductor 82 and the cathode thereof is connected to conductor 73.

A temperature compensated bias current $I_{BIAS}$, which is constant at a particular temperature, is produced in the collector of PNP current mirror transistor 74. Transistor 74 has its base connected to the base of PNP transistor 75 and the emitter of PNP transistor 77. The emitter of transistor 74 is connected by resistor 74A to $+V_{CC}$. The emitter of transistor 75 is connected by resistor 76 to $+V_{CC}$, and the collector of transistor 75 is connected by conductor 79 to the base of transistor 77, and to the collector of NPN transistor 92. Transistors 74, 75 and 77 form a PNP current mirror circuit, the currents in which are controlled by the circuitry including NPN transistors 93, 95, and 96, and by the current mirror circuit 45 shown in FIG. 1. The emitter area of transistor 74 is twice that of transistor 75, so a current equal to $I_{BIAS}/2$ is caused (by transistor 93 and resistor 94) to flow in the collector of transistor 75, and twice that current, i.e., $I_{BIAS}$, is caused to flow in the collector of transistor 74. Resistor 97 is connected between conductors 25 and 98.

The base of NPN transistor 92 is connected to ground, and its emitter is connected to the collector of transistor 93. The emitter of transistor 93 is coupled by resistor 94 to $-V_{CC}$. The base of transistor 93 is connected by conductor 25 to the collector and base of diode-connected NPN transistor 95. Diode-connected transistor 96 has its collector and base connected to the emitter of transistor 95 and it has its emitter connected to conductor 98. A 48 ohm resistor 99 is connected between conductor 98 and $-V_{CC}$.

Exemplary values of the various components shown in the circuit of FIGS. 1 and 2 are shown in Table 1.

TABLE 1

| Component | Value |
|---|---|
| Resistor 17 | 10 Kilohms for MSB; 20 kilohms for other bits |
| Resistor 19 | 4.25 kilohms for two MSBs, 8.7 kilohms for other bits |
| Resistor 21 | 1.6 kilohm 6 |
| Resistor 28 | 5 kilohms |
| Resistor 29 | 1.6 kilohm |
| Resistor 35 | 925 ohms |
| Resistor 36 | 800 ohms |
| Resistor 40 | 27 kilohms |
| Resistor 41 | 27 kilohms |
| Resistor 55 | 13.4 kilohms |
| Resistor 56 | 5.4 kilohms |
| Resistor 58 | 3.35 kilohms |
| Resistor 59 | 6.15 kilohms |
| Resistor 61 | 500 ohms |
| Resistor 74A | 250 ohms |
| Resistor 76 | 500 ohms |
| Resistor 81 | 24 ohms |
| Resistor 84 | 2 kilohms |
| Resistor 86 | 5 kilohms |
| Resistor 88 | 24 ohms |
| Resistor 90 | 2 kilohms |
| Resistor 94 | 1.65 kilohms |
| Resistor 97 | 9 kilohms |
| Resistor 99 | 48 ohms |
| Capacitor 50 | .1 microfarads |

Next, the operation of the output push-pull stage 69 of FIG. 2 will be described. In understanding the operation of push-pull output stage 69, it is important to realize that the monolithic DAC 1, represented by the circuit schematic diagrams of FIGS. 1 and 2, is to be processed with a "standard" monolithic bipolar integrated circuit manufacturing process in which the "normal" collector-to-emitter breakdown voltage $BV_{CEO}$ of the NPN transistors is roughly 18 volts to 22 volts. The various resistors can be, for example, thin film nichrome resistors or diffused P type resistors formed during the same operation in which the base regions of the NPN transistors are formed.

It should also be appreciated that pullup transistor 80 has its collector connected directly to $+V_{CC}$, rather than being coupled in series with other circuitry which would absorb some of the excess collector-to-emitter voltage that otherwise would be applied to transistor 80 when NPN pulldown transistor 87 pulls $V_{OUT}$ to a voltage approaching $-V_{CC}$, and the resulting difference between $V_{OUT}$ and $+V_{CC}$ exceeds the normal collector-to-emitter breakdown voltage.

As used herein, the term "normal" or "on" collector-to-emitter breakdown voltage of an NPN transistor refers to a collector-to-emitter breakdown voltage when that transistor is considered to be "on" and is conducting an appreciable collector current, for example at least 0.1 milliamperes.

In accordance with an important aspect of the present invention, NPN pulldown transistor 87 has its emitter coupled to $-V_{CC}$ by a small value (24 ohms) resistor 88, and has its collector connected directly to output conductor 82, rather than by means of additional circuitry that would absorb excess collector-to emitter overvoltage that otherwise would be applied in the event that pullup transistor 80 pulls $V_{OUT}$ to a value approaching $+V_{CC}$, and the resulting difference between $V_{OUT}$ and $-V_{CC}$ exceeds the "normal" collector-to-emitter breakdown voltage of pulldown transistor 87.

Those skilled in the art will appreciate that, in an NPN transistor with a collector current of greater than approximately 50 microamperes, impact ionization occurring in the collector-base depletion region can lead to the avalanche phenomena, greatly reducing the breakdown voltage of that transistor such as 80 or 87.

Figure 4:
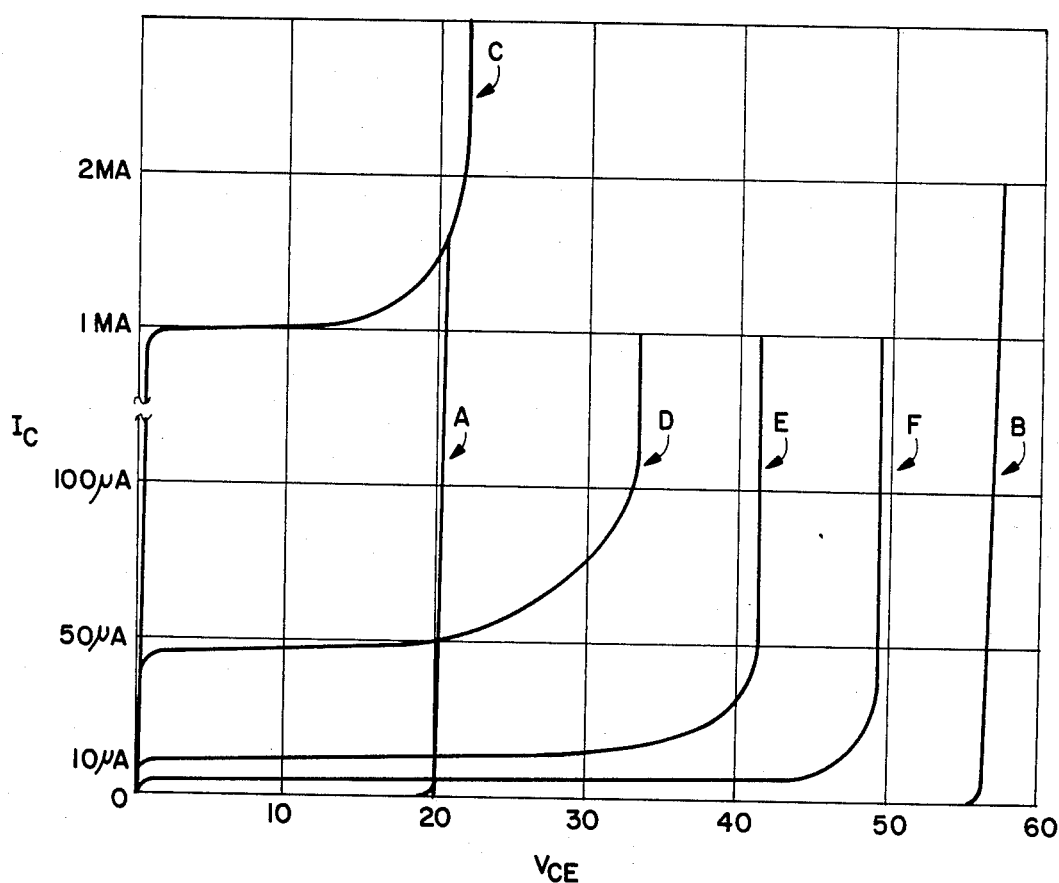
FIG. 4 is a diagram showing the collector-to-emitter breakdown characteristics of an NPN transistor as a function of its base current and collector current.

The manner in which the collector-to-emitter breakdown voltage varies with collector current and base current will be discussed with reference to FIG. 4, as an understanding of this will be helpful to understanding the operation of the push-pull output stage of FIG. 2. Referring now to FIG. 4, the $I_C$ (collector current) versus $V_{CE}$ (collector-to-emitter) voltage characteristic of a typical NPN transistor, such as pullup transistor 80, is shown. Curve A shows the $BV_{CEO}$ (collector-to-emitter breakdown voltage with base open) characteristic of pullup transistor 80 (or pulldown transistor 87). For collector currents in excess of a few microamperes, $BV_{CEO}$ is about 20 volts. Curve B is the $BV_{CES}$ (collector-to-emitter breakdown voltage with base shorted to emitter) characteristic. At collector currents in excess of a few microamperes, $BV_{CES}$ is about 56 volts. Those skilled in the art know that $BV_{CEO}$ is much lower than $BV_{CES}$ because reverse collector-base junction leakage current flows into the base region of the transistor and is multiplied by the current gain "beta" of the transistor, producing a greatly amplified (by a factor of several hundred) collector current that causes impact ionization to occur at a collector-to-emitter voltage of about 20 volts. This causes rapid avalanche breakdown, which in turn often causes destruction of the transistor and/or other harmful effects.

Curves C, D, E and F represent $BV_{CER}$ (collector-to-emitter breakdown voltages with a 2 kilohm resistor connected between the base and emitter) with successively lower values of constant current drive into the base and 2 kilohm resistor when it is tested by means of a conventional curve tracer.

The resistors 84 and 90 of FIG. 2 thus affect the collector-to-emitter breakdown voltage of pullup transistor 80 and pulldown transistor 87, respectively, when they are off. It can be seen that turning pullup transistor 80 or pulldown transistor 87 nearly off when the other one of them is supplying or sinking a high output current doesn't necessarily increase its collector-to-emitter breakdown voltage, as evidenced by curve A in FIG. 4. In addition to turning the transistor nearly off, a path has to be provided to shunt the collector-base leakage current out of the base to prevent the beta multiplication in order to increase the collector-to-emitter breakdown voltage toward $BV_{CES}$, as indicated by curve F of FIG. 4. With this background, the description of the operation of the push-pull circuit of the present invention can proceed.

Under quiescent operating conditions, in which the analog summing junction current or DAC output current $I_{OUT}$ is zero, $V_{OUT}$ is zero volts. Then, assuming room temperature operation, $I_{BIAS}$ is also about 0.7 milliamperes. The current through $R_L$ is zero. The current $I_4$ through pullup transistor 80 is about 0.5 milliamperes and the current through resistor 84 is about 0.35 milliamperes. Therefore, the current $I_7$ (the sum of $I_3$ and $I_4$) in pulldown transistor 87 is about 0.85 milliamperes. Since $I_3$ is about 0.35 milliamperes, $I_2$ is also about 0.35 milliamperes. (It is assumed that all of the base currents are negligible.) Hence, $I_6$ is also about 0.35 milliamperes.

Several examples of the operation of the output state will now be given.

First, if the analog current $I_{OUT}$ (conductor 24) has a sufficiently large value to cause $V_{OUT}$ to be driven to $+10$ volts, then the current through $R_L$ ($R_L = 5$ kilohms) is increased to about 2 milliamperes from the zero quiescent value. The current $I_q$ through $R_F$ is 1 milliampere. Then $I_{OH}$ is 3 milliamperes. Our computer simulation results show that the current $I_4$ is about 2.6 milliamperes. Then $I_3$, and hence $I_1$, are increased to about 0.4 milliampere due to the increase in the sum of the voltage drops across resistor 81 and the $V_{BE}$ of transistor 80 and an essentially equal increase in the voltage drop across resistor 84. This causes $I_2$, and hence $I_6$, to be decreased to about 0.3 milliampere, since $I_{BIAS}$ is constant with respect to changes in output current, thus reducing the voltage between the base of transistor 87 and $-V_{CC}$ to about 0.6 volt, which causes pulldown transistor 87 to be nearly off. Thus, the feedback through resistor 81 and the emitter of pullup transistor 80 causes a reduction in $I_2$ in response to the increase in output current supplied by pullup transistor 80, which reduction nearly turns off pulldown transistor 87. This reduction in $I_2$ results in a low enough voltage across resistor 90 that the voltage drop across low resistance (2 kilohm) shunt resistor 90 allows the collector-base reverse leakage current to flow out of the base of pulldown transistor 87, substantially increasing its collector-to-emitter breakdown voltage, as explained above with reference to FIG. 4. Our computer simulations show that this results in about 0.2 microampere of current flowing through pulldown transistor 87, greatly increasing its breakdown voltage.

As a second example, with $R_L$ increased from 5 kilohms to infinity, and with $V_{OUT}$ equal to $+10$ volts, and $+V_{CC}$ equal to $+15$ volts, and $-V_{CC}$ equal to $-15$ volts, our simulations show that the current $I_4$ is about 0.65 milliampere, $I_3$ and hence $I_1$, are increased slightly from the 0.35 milliampere quiescent value and $I_2$ is decreased slightly from quiescent value. (The "worst case" or highest value of $I_7$ through pulldown transistor 87 occurs when $R_L$ is infinite.) This results in a decrease in the forward bias voltage from the quiescent value on the base of pulldown transistor 87, leading to a value of $I_7$ of approximately 20 microamperes. This worst case value of $I_7$ inceases the collector-to-emitter breakdown voltage of pulldown transistor 87 well beyond the 25 volt collector-to-emitter voltage being applied to pulldown transistor 87 (in accordance with FIG. 4), despite the higher value of current $I_7$ compared to the previous example.

As a third example, assume that the input value of $I_{OUT}$ results in pulldown transistor 87 being turned on, pulling $V_{OUT}$ down to $-10$ volts. This produces a 25 volt collector-to-emitter voltage across pullup transistor 80. The current flowing through $R_L$ from ground to conductor 82 is increased to about 2 milliamperes from the quiescent value. The current flowing from conductor 24 through $R_F$ to conductor 82 is about 1 milliampere. The current $I_7$ ($I_3 + I_{OL}$) through pulldown transistor 87 is about 3.3 milliamperes. This increase in output current drawn by pulldown transistor 87 causes feedback in the form of an increased voltage across resistor 88 and an essentially equal increase in the voltage across resistor 90, leading to an increase in $I_2$ and a corresponding decrease in $I_1$. More particularly, $I_2$ is increased to about 0.4 milliampere, causing $I_1$, and hence $I_3$, to be reduced to about 0.3 milliampere. This reduces the voltage between the base of pullup transistor 80 and conductor 82 to about 0.6 volt. Our simulations show that this produces about a 0.5 microampere current in pullup transistor 80, increasing its collector-to-emitter breakdown voltage well beyond the 25 volt collector-to-emitter voltage being applied thereto at the present value of $V_{OUT}$.

As a further example, if the load resistance $R_L$ is increased from 5 kilohms to infinity, then our simulation results show that $I_7$ is about 1.35 milliamperes. The feedback current through $R_F$ is still 1 milliampere. $I_2$ is increased slighly above the quiescent value of 0.35 milliampere, causing $I_1$, and hence $I_3$, to be decreased slightly below the quiescent value of about 0.35 milliampere. The increased voltage across resistor 84 increases $I_4$ to about 40 microamperes. At this condition, the collector-to-emitter breakdown voltage of pullup transistor 80 is still well in excess of the 25 volts being applied thereto.

Next, it is necessary to consider how increasing the operating temperature affects the above described operation of the output stage 69. Increasing the operating temperature decreases the emitter-to-base voltages of the transistors. For example, under the quiescent condition, as temperature increases from room temperature to, say, $+125$ degrees Centigrade, the $V_{BE}$ of pullup transistor 80 decreases by approximately 200 millivolts. Therefore, $I_{BIAS}$ must be reduced enough to maintain about the same quiescent current in pullup transistor 80 and pulldown transistor 87 as at room temperature.

Figure 3:
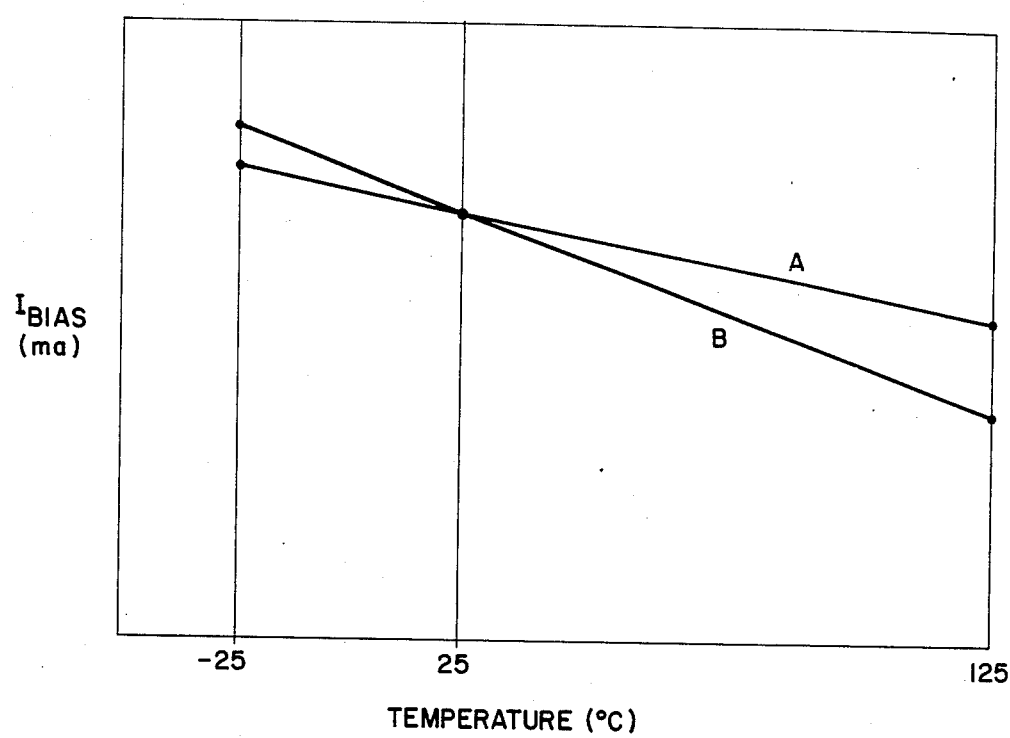
FIG. 3 is a diagram useful in describing the operation of the circuit of FIG. 2.

In order to avoid drastic increases in the quiescent currents in the pullup transistor 80 and pulldown transistor 87 as temperature increases, the circuit 70 shown in FIG. 2 decreases $I_{BIAS}$ as temperature increases, generally in accordance with the graph shown in FIG. 3.

The PNP current mirror circuit including transistors 74 and 75 causes $I_{BIAS}$ to be twice the current flowing in PNP transistor 75. The manner in which circuit 70 of FIG. 2 decreases $I_{BIAS}$ as temperature increases can be understood by realizing first, that NPN transistor 92 is optional, and only performs the function of protecting transistor 93 from excessive collector-to-emitter voltage, if necessary. The emitter geometries of transistors 93 and 95 are appropriately scaled so that the voltage at the emitter of NPN transistor 93 is essentially equal to the voltage at the emitter of diode-connected transistor 95, over the operating temperature range of $-25$ to $+125$ degrees Centigrade. Hence, the voltage drop across diode-connected transistor 96 plus the small voltage drop across resistor 99 is essentially equal to the voltage drop across resistor 94.

Next, it is important to realize that the current mirror circuit 70 of FIG. 2 provides an essentially constant current through conductor 25, which current divides between the path including diode-connected transistors 95 and 96 and the path including resistor 97. As the temperature increases, the emitter-to-base voltages of diode-connected transistors 95 and 96 decrease. This decrease results in a decrease in the voltage across resistor 94, and hence decreases $I_{BIAS}/2$. The upper curve A in FIG. 3 illustrates qualitatively the decrease in $I_{BIAS}/2$ if resistor 97 is omitted; curve A shows a relatively linear decrease in $I_{BIAS}/2$ as temperature increases. Our simulations of circuit operation show that this rate of decrease is not sufficient to maintain constant quiescent currents in the pullup and pulldown transistors 80 and 87. The effect of adding resistor 97 is to accelerate the rate of decrease of $I_{BIAS}/2$ as temperature increases, as indicated by curve B in FIG. 3. Resistor 97 shunts part of the current from conductor 25 away from diode connected transistors 95 and 96, thereby lowering the current density therein.

This decrease in current density increases the rate of $V_{BE}$ change in transistors 95 and 96 with respect to temperature. This results in a greater rate of decrease in the voltage across resistor 94, and thus in $I_{BIAS}/2$ as temperature increases.

The net effect of the bias current circuit 70, then, is to lower $I_{BIAS}$ enough as temperature increases so that the current $I_1$ or $I_2$ conducted by the output transistor (80 or 87) which is supplying or sinking a large output current and its associated resistor (84 or 90) is high enough to "starve" the other output transistor and its resistor (84 or 90), and thereby allow the collector-base reverse leakage current of that starved output transistor to be shunted out of the base of that output transistor. This raises the collector-to-emitter breakdown voltage of that starved output transistor from its $BV_{CEO}$ value to a much higher value that depends on the value of the resistor 84 or 90, in accordance with the prior discussion of FIG. 4. The 48 ohm resistor 99 is ratio-matched with 24 ohm resistors 81 and 88 with respect to processing and temperature variations. Resistor 94 is ratio-matched to resistors 84 and 90 with respect to processing and temperature variations. The amount of current supplied into conductor 25 by PNP current mirror circuit 70 of FIG. 1 controls $I_{BIAS}/2$, and hence $I_{BIAS}$.

Therefore, forcing an essentially constant current into diode-connected transistor 96 and 48 ohm resistor 99 controls the voltage across and hence the current through resistor 94, and thereby causes temperature dependent current $I_{BIAS}/2$ to flow in resistor 94. The PNP current mirror circuit 74, 75 doubles this current to produce $I_{BIAS}$, which then is split into currents $I_1$ and $I_2$, to provide proportional, temperature dependent currents to flow in resistors 84 and 90. One skilled in the art will recognize that these currents produce voltages that cause transistor 80 and resistor 81 to produce an essentially constant, relatively temperature-independent current $I_4$, and cause transistor 87 and resistor 88 to produce an essentially constant, relatively temperature-independent current $I_7$. Analagous operation occurs under non-quiescent conditions, and even at high or low temperatures, the collector current in the output transistor not supplying or sinking output current is so low that its collector-to-emitter breakdown voltage is raised to a safe value.

To summarize, the described embodiment of the invention produces a push-pull output stage which provides an output voltage that readily swings to within about 1.4 volts of either the positive or negative power supply, and is operable at $+V_{CC}$ voltages of $+4.75$ volts up to $+15$ volts or greater, and at $-V_{CC}$ voltages of $-4.75$ volts to $-15$ volts or more negative, over a $-25$ to $+125$ degree Centigrade temperature range. The push-pull output stage is incorporated in a 16 bit DAC which operates over the same power supply voltage and temperature ranges, and easily interfaces with worst case TTL digital input logic levels. The described DAC accomplishes this while avoiding use of complex amplifier output stage circuit structures which typically are used to protect the output transistors against breakdown at high power supply voltages. Both external filtering and bit current adjustment functions are accomplished using a single lead of the DAC.

While the invention has been described with reference to a particular embodiment thereof, those skilled in the art will be able to make various modifications to the described embodiments without departing from the spirit and scope of the invention. For example, the technique of operating the circuit to provide an external path for collector-base reverse leakage currents of each transistor before subjecting it to collector-to-emitter over voltages can be used on output circuits other than push-pull circuits. In FIG. 2, by omitting resistor 97 and inserting a resistor in series with the base of one of diodes 95 or 96, the same effect of increased thermal drift can be achieved. In FIG. 1, resistor 61 can be omitted if there is no need to scale down the voltage on conductor 49. Although positive and negative power supply voltages ($+V_{CC}$ and $-V_{CC}$) are used in the described example of the invention, obviously it makes not difference what voltage the power supply voltages are referenced to. For example, all of the supply voltages, including ground, could be shifted up by $V_{CC}$ volts.

It should be appreciated that the various current values given for the purpose of illustrating the operation of the push-pull circuit are selected for ease of illustration and are not to be interpreted as being exact, although the illustrative current values are selected on the various of various computer simulations.

We claim:
1. A push-pull output circuit comprising:
   (a) a pullup transistor having a collector coupled to a first supply voltage conductor and an emitter coupled to an output conductor;
   (b) a pulldown transistor having a collector coupled to the output conductor and an emitter coupled to a second supply voltage conductor;

(c) first circuit means responsive to an output voltage of the output conductor for increasing the collector-to-emitter breakdown voltage of the pulldown transistor to a level that exceeds the voltage difference between the output conductor and the second supply voltage conductor by reducing the base-to-emitter voltage of the pulldown transistor to a sufficiently low level to reduce the current in the pulldown transistor to a very low level and providing a path having a predetermined resistance that is low enough to cause the collector-base reverse leakage current to flow out of the base of the pulldown transistor;

(d) second circuit means responsive to the output voltage for increasing the collector-to-emitter breakdown voltage of the pullup transistor to a level that exceeds the voltage difference between the output conductor and the first supply voltage conductor, by reducing the base-to-emitter voltage of the pullup transistor to a sufficiently low level to reduce the current in the pullup transistor to a very low level and by providing a path having a predetermined resistance that is low enough to cause the collector-base reverse leakage current to flow out of the base of the pullup transistor;

(e) bias current means for producing a bias current that is essentially constant with respect to the output current in the output conductor; and (f) means for supplying a first portion of the bias current to a first conductor coupled to the base of the pullup transistor, and supplying a second portion of the bias current to a second conductor coupled to the base of the pulldown transistor wherein the second circuit means includes first feedback means coupled between the emitter and base of the pullup transistor for increasing the first portion of the bias current, and thereby reducing the second portion of the bias current, as output current supplied by the pullup transistor increases, the reduced second portion of the bias current substantially reducing the base-to-emitter voltage of the pulldown transistor;

wherein the first circuit means includes means coupled between the emitter and base of the pulldown transistor for increasing the second portion of the bias current as output current sunk by the pulldown transistor increases, thereby reducing the first portion of the bias current and substantially reducing the base-to-emitter voltage of the pullup transistor;

wherein the bias current means includes means for decreasing the bias current as temperature of the push-pull output circuit increases, the bias current decreasing means including a current mirror current source controlled by a current control circuit, the current control circuit including first and second series-connected diodes in parallel connection with a path including the emitter-base junction of a first transistor connected in series with a first resistor, and also in parallel connection with a second resistor, the resulting voltage drop across the first resistor controlling the value of the bias current.

2. The push-pull output circuit of claim 1 wherein a collector-to-emitter breakdown voltage of the pullup transistor, when it is on, is less than the voltage difference between a minimum value of the output voltage and the voltage of the first supply voltage conductor.

3. The push-pull output circuit of claim 1 wherein a collector-to-emitter breakdown voltage of the pulldown transistor, when it is on, is less than the voltage between a maximum value of the output voltage and the voltage of the second supply voltage conductor.

4. The push-pull output circuit of claim 1 wherein the input circuit means includes a first transistor and means responsive to the input signal for increasing the voltage of the base of the pullup transistor to a value about equal to the first supply voltage minus the collector-to-emitter saturation voltage of the first transistor, and thereby causing the output voltage to be increased to a value about equal to the first supply voltage minus the sum of the collector-to-emitter saturation voltage of the first transistor and the base-to-emitter voltage of the pullup transistor.

5. The push-pull output circuit of claim 1 wherein the second circuit means includes a third resistor connected between the emitter of the pullup transistor and the output conductor, and a fourth resistor connected between the base of the pullup transistor and the output conductor.

6. The push-pull output circuit of claim 5 wherein the first circuit means includes a fifth resistor connected between the emitter of the pulldown transistor and the second supply voltage conductor and a sixth resistor connected between the base of the pulldown transistor and the second supply voltage conductor.

7. The push-pull output circuit of claim 6 wherein the values of the sixth and fourth resistors are sufficiently low to ensure that the $BV_{CER}$ breakdown voltage of the pullup transistor is always less than the voltage difference between the output conductor and the first supply voltage conductor and that the $BV_{CER}$ breakdown voltage of the pulldown transistor is always less than the voltage difference between the output conductor and the second supply voltage conductor, respectively.

8. A method of operating a push-pull circuit comprising the steps of:

(a) producing a bias current by means of a current mirror circuit having a current control input and supplying a first portion of the bias current to a first conductor coupled to the base of a pullup transistor having its emitter coupled to an output conductor, and supplying the remaining portion of the bias current to a second conductor coupled to the base of a pulldown transistor having its collector coupled to the output conductor, the collector of the pullup transistor being connected to a first supply voltage conductor and the emitter of the pulldown transistor being coupled to a second supply voltage conductor, the bias current being essentially constant with respect to variations in the voltage of the output conductor;

(b) causing the pullup transistor to supply an output current to an output conductor, thereby increasing an output voltage of the output conductor, and increasing the first portion of the bias current in response to the increase in output current, thereby decreasing the remaining portion of the bias current;

(c) simultaneously with step (b), reducing the base-to-emitter voltage of the pulldown transistor enough to lower the current therein to a very low level in response to the reduction of the remaining portion of the bias current, and conducting a sufficient amount of the reverse leakage current of the collector-base junction of the pulldown transistor out of the base of the pulldown transistor to increase the collector-to-emitter breakdown voltage of the pulldown transistor to a level that exceeds the voltage difference between the output conductor and the second supply voltage conductor; and (d) decreasing the bias current with respect to the temperature of the push-pull circuit by coupling the current control input of the current mirror circuit to a current control circuit including first and second series-connected diodes coupled in parallel connection with a path including a first transistor connected in series with a first resistor and also in parallel connection with a second resistor and controlling a value of a current flowing through the current control input in response to the voltage across the first resistor.

9. The method of claim 8 including causing the pulldown transistor to sink an output current from the output conductor, and increasing the second portion of the bias current in response to the increase in the sunk output current, thereby decreasing the first portion of the bias current, and simultaneously turning the pullup transistor off by reducing the base-to-emitter voltage of the pullup transistor enough to turn it off in response to the decrease in the first portion of the bias current, and conducting a sufficient amount of the reverse leakage current of the collector-base junction of the pullup transistor out of the base of the pullup transistor to increase the collector-to-emitter breakdown voltage of the pullup transistor to a level that exceeds the voltage difference between the first supply voltage conductor and the output conductor.

10. A high voltage push-pull output circuit comprising in combination:
    (a) an NPN pullup transistor having a collector coupled to a first supply voltage conductor and an emitter coupled to an output conductor;
    (b) an NPN pulldown transistor having a collector coupled to the output conductor and an emitter coupled to a second supply voltage conductor;
    (c) a first resistor coupled between the emitter of the pullup transistor and the output conductor, a second resistor coupled between the base of the pullup transistor and the output conductor, a third resistor coupled between the emitter of the pulldown transistor and the second supply voltage conductor, and a fourth resistor coupled between the base of the pulldown transistor and the second supply voltage conductor;
    (d) a first PNP transistor having its emitter coupled to the base of the pullup transistor and its collector coupled to the base of the pulldown transistor, the base of the first PNP transistor being coupled to the output of an amplifier;
    (e) a PNP current mirror circuit having a current output terminal coupled to the emitter of the first PNP transistor and also having a control current input terminal; and
    (f) a temperature-sensitive control circuit having a control current output terminal coupled to the control input terminal of the PNP current mirror circuit, the temperature-sensitive control circuit including means for causing a reduction in a bias current flowing through the control current output of the PNP current mirror circuit as the temperature of the high voltage push-pull output circuit increases, the reduction of the bias current being sufficient to keep the collector current through whichever one of the pullup transistor and the pulldown transistor that is not supplying or sinking a large output current at a very low level.

11. The high voltage push-pull output circuit of claim 10 wherein the temperature control circuit includes a first NPN transistor having its collector connected to the control current output terminal and its emitter coupled by a fifth resistor to the second supply voltage conductor, a second NPN transistor having its collector and base coupled to the base of the first NPN transistor and to one terminal of a sixth resistor and having its emitter coupled to the collector and base of a third NPN transistor, the emitter of the third NPN transistor being coupled to the other terminal of the sixth resistor and to one terminal of a seventh resistor, the other terminal of the seventh resistor being connected to the second supply voltage conductor, the base of the first NPN transistor also being coupled to a constant current source.

12. A high voltage push-pull output circuit comprising in combination:
    (a) an NPN pullup transistor having a collector coupled to a first supply voltage conductor and an emitter coupled to an output conductor;
    (b) an NPN pulldown transistor having a collector coupled to the output conductor and an emitter coupled to a second supply voltage conductor;
    (c) a first resistor coupled between the emitter of the pullup transistor and the output conductor, a second resistor coupled between the base of the pullup transistor and the output conductor, a third resistor coupled between the emitter of the pulldown transistor and the second supply voltage conductor, and a fourth resistor coupled between the base of the pulldown transistor and the second supply voltage conductor;
    (d) a first PNP transistor having its emitter coupled to the base of the pullup transistor and its collector coupled to the base of the pulldown transistor, the base of the first PNP transistor being coupled to the output of an amplifier; and
    (e) a PNP current mirror circuit having a current output terminal coupled to the emitter of the first PNP transistor and also having a control current input terminal.

* * * * *